(12) United States Patent
Chua et al.

(10) Patent No.: US 7,951,639 B2
(45) Date of Patent: May 31, 2011

(54) METHOD OF ZINC OXIDE FILM GROWN ON THE EPITAXIAL LATERAL OVERGROWTH GALLIUM NITRIDE TEMPLATE

(75) Inventors: Soon Jin Chua, Singapore (SG); Hailong Zhou, Singapore (SG); Jianyi Lin, Singapore (SG); Hui Pan, Singapore (SG)

(73) Assignee: National University of Singapore, Singapore (SG)

( * ) Notice: Subject to any disclaimer, the term of this patent is extended or adjusted under 35 U.S.C. 154(b) by 393 days.

(21) Appl. No.: 12/288,977

(22) Filed: Oct. 24, 2008

(65) Prior Publication Data

US 2010/0102307 A1    Apr. 29, 2010

(51) Int. Cl.
  *H01L 21/00* (2006.01)
  *H01L 29/12* (2006.01)
(52) U.S. Cl. ............... 438/85; 438/46; 438/93; 438/489; 257/43; 257/78
(58) Field of Classification Search .................. 438/46, 438/85, 93, 489; 257/43, 78, 200, 201
See application file for complete search history.

(56) References Cited

U.S. PATENT DOCUMENTS

| | | | |
|---|---|---|---|
| 6,462,355 B1 | 10/2002 | Linthicum | |
| 6,500,257 B1 | 12/2002 | Wang | |
| 6,599,362 B2 | 7/2003 | Ashby | |
| 6,657,232 B2 | 12/2003 | Morkoc | |
| 6,812,053 B1 | 11/2004 | Kong | |
| 7,172,813 B2 * | 2/2007 | Burgener et al. ............ | 428/446 |
| 2002/0020341 A1 | 2/2002 | Marchand et al. | |
| 2003/0089906 A1 | 5/2003 | Ueda | |
| 2003/0146433 A1* | 8/2003 | Cantwell et al. ............... | 257/43 |
| 2003/0186088 A1 | 10/2003 | Kato et al. | |
| 2004/0201030 A1 | 10/2004 | Kryliouk et al. | |
| 2005/0072353 A1 | 4/2005 | Lee et al. | |
| 2005/0269565 A1* | 12/2005 | Nause et al. ..................... | 257/43 |

(Continued)

FOREIGN PATENT DOCUMENTS

EP    1482549    6/2009

(Continued)

OTHER PUBLICATIONS

Fareed et al. "air-bridged lateral growth of crack-free AlGaN on highly relaxed porous GaN", Applied Physics Letters, 84, 2004, pp. 696-698.

(Continued)

*Primary Examiner* — Kevin M Picardat
(74) *Attorney, Agent, or Firm* — Schwabe, Williamson & Wyatt, P.C.

(57) ABSTRACT

A growth method is proposed for high quality zinc oxide comprising the following steps: (1) growing a gallium nitride layer on a sapphire substrate around a temperature of 1000° C.; (2) patterning a $SiO_2$ mask into stripes oriented in the gallium nitride <1$\bar{1}$00> or <11$\bar{2}$0> direction; (3) growing epitaxial lateral overgrowth of (ELO) gallium nitride layers by controlling the facet planes via choosing the growth temperature and the reactor; (4) depositing zinc oxide films on facets ELO gallium nitride templates by chemical vapor deposition (CVD). Zinc oxide crystal of high quality with a reduced number of crystal defects can be grown on a gallium nitride template. This method can be used to fabricate zinc oxide films with low dislocation density lower than $10^4/cm^{-2}$, which will find important applications in future electronic and optoelectronic devices.

20 Claims, 8 Drawing Sheets

U.S. PATENT DOCUMENTS

| | | |
|---|---|---|
| 2006/0060866 A1 | 3/2006 | Tezen |
| 2008/0157090 A1* | 7/2008 | Thomson et al. ............ 257/66 |
| 2009/0020781 A1* | 1/2009 | Lai ........................... 257/103 |

FOREIGN PATENT DOCUMENTS

| | | |
|---|---|---|
| JP | 2005039107 | 2/2005 |
| KR | 1020050058954 | 6/2005 |
| WO | WO2004083499 | 9/2004 |

OTHER PUBLICATIONS

Liang et al. "Two-dimensional lateral superlattices of nanostructures: Nonlithographic formation by anodic membrane template", Journal of Applied Physics, 91, 2002, pp. 2544-2546.

Sander et al. "Nannoparticle Arrays on Surfaces Fabricated Using Anodic Alumina Films as Templates", Advanced Functional Materials, 13, 2003, pp. 393,-397.

R.D. "Vispute et al., Heteroepitaxy of ZnO on GaN and its implications for fabrication of hybrid optoelectronic devices", Applied Physics Letters, vol. 73, No. 3, Jul. 20, 1998.

D.C. Reynolds, et al. "Optically Pumped Ultraviolet Lasing from ZnO", Solid State Communication, vol. 99, No. 12, pp. 873-875, 1996.

Huang et al. "Room-Temperature Ultraviolet Nanowire Nanolasers", www.sciencemag.org, vol. 292, Jun. 8, 2001.

Kawasaki et al. "Ultraviolet Excitonic Laser Action at Room Temperature in ZnO Nanocrystalline Epitaxial Films", Materials Science Forum vols. 264-268 (1998) pp. 1459-1462.

Bagnall et al. "Optically pumped lasing of ZnO at room termpature", Institute of Material Reserach, Tohoku University 2-1-1- Katahira, Aoba-ku, 980 Sendai, Japan.

Srikant et al. "Epitaxial Aluminum-Doped Zinc Oxide Thin Films on Sapphire: 1, Effect of Substrate Orientation", J. Am. Ceram. Soc. 78 [7] 1931-34 (1995).

Nishinaga et al., "Epitaxial Lateral Overgrowth of GaAs by LPE", Japanese Journal of Applied Physics, vol. 27, No. 6, Jun. 1998, pp. L964-L967.

Zheleva et al, Dislocation density reduction vial lateral epitaxy in selectively grown GaN structures, App. Phys. Lett. 71 (17), Oct. 27, 1997, American Institute of Physics.

Honda et al., Transmission Electron Microscopy Investigation of Dislocations in GaN Layer Grown by Facet-Controlled epitaxial Lateral Overgrowth, Japan J. Appl. Physics, vol. 40 (2001) pp. L309-L312, Part 2, No. 4A, Apr. 1, 2001.

Joo et al., Synthesis of ZnO Nanocrystals with Cone, Hexagonal Cone, and Rod Shapes via Non-Hydrolytic Ester Elimination Sol-Gel Reactions, Adv. Mater. 2005, 17, 1873-1877.

Hirth et al. Theory of Dislocations, Second Edition, 2nd ed. Wiley, New York, (1982).

International Preliminary Examination Report for WO07123496 dated Oct. 28, 2008.

Restriction Requirement dated May 28, 2008 for U.S. Appl. No. 11/434,399.

Response to Restriction Requirement dated Jun. 30, 2008 for U.S. Appl. No. 11/434,399.

Non-final OA dated Aug. 25, 2008 for U.S. Appl. No. 11/434,399.

Response to Non-final OA dated Nov. 25, 2008 fro U.S. Appl. No. 11/434,399.

Final OA dated Mar. 4, 2009 for U.S. Appl. No. 11/434,399.

RCE dated Jun. 2, 2009 for U.S. Appl. No. 11/434,399.

Fareed et al., "Air-bridged lateral growth of crack-free Ai0.24Ga0.76N on highly relaxed porous GaN," Applied Physics Letters, vol. 84, No. 5, Feb. 2, 2004, pp. 696-698, American Institute of Physics, Columbia South Carolina.

Liang et al., "Two-dimensional lateral superlattices of nanostructures: Nonlithographic formation by anodic membrane template," Journal of Applied Sciences, vol. 9, No. 4, Feb. 15, 2002, pp. 2544-2546, American Institute of Physics.

Sander et al., "Nanoparticle Arrays on Surfaces Fabricated Using Anodic Alumina Films as Templates," Advanced Functional Materials 2003, 13, No. 5, May, pp. 393-397, Wiley-VCH Verlag GmbH & Co. KGaA, Weinheim.

Office action mailed Aug. 18, 2009 for U.S. Appl. No. 11/434,399.

* cited by examiner

METHOD OF ZINC OXIDE FILM GROWN ON THE EPITAXIAL LATERAL OVERGROWTH GALLIUM NITRIDE TEMPLATE

This application claims priority to U.S. Provisional Patent Application Ser. No. 60/794,775 filed on Apr. 25, 2006, which is herein incorporated by reference in its entirety.

BACKGROUND OF THE INVENTION (1) Field of the Invention

This invention relates to the formation of high quality zinc oxide films in the fabrication of electronic and optoelectronic devices, and more particularly, to the growth of zinc oxide on epitaxial lateral overgrown (ELO) gallium nitride templates.

(2) Description of the Related Art

As a direct band gap semiconductor with a room temperature energy gap of 3.37 eV, zinc oxide presents interesting electrical, optical, acoustic and chemical properties, which may find wide applications in the fields of optoelectronics, sensors and catalysis. With a large exciton binding energy (60 meV) [R. D. Vispute, V. Talyansky, S. Choopun, R. P. Sharma, T. Venkatesan, M. He, X. Tang, J. B. Halpern, M. G. Spencer, Y, X. Li, L. G. Salamanca-Riba, A. A. Iliadis and K. A. Jones, *Appl. Phys. Lett.* 73, 348 (1998).] and low power thresholds [D. C. Reynolds, D. C. Look, and B. Jogai, *Solid State Commun.* 99, 873 (1996).], zinc oxide is also being considered as a promising material for UV and blue light emitting devices. [M. H. Huang, S. Mao, H. Feick, H. Yan, Y. Wu, H. Kind, E. Weber, R. Russo, and P. Yang, *Science* 292, 1897 (2001); M. Kawasaki, A. Ohtomo, H. Koinuma, Y. Sakurai, Y. Yoshida, Z. K. Tang, P. Yu, G. K. L. Wang, and Y. Segawa, *Mater. Sci. Forum* 264, 1459 (1998).; D. M. Bagnall, Y. F. Chen, Z. Zhu, T. Yao, S. Koyama, M. Y. Shen, and T. Goto, *Appl. Phys. Lett.* 70, 2230 (1997).] Epitaxial zinc oxide films have been grown on sapphire by several groups [M. Kawasaki, A. Ohtomo, H. Koinuma, Y. Sakurai, Y. Yoshida, Z. K. Tang, P. Yu, G. K. L. Wang, and Y. Segawa, *Mater. Sci. Forum* 264, 1459 (1998).; D. M. Bagnall, Y. F. Chen, Z. Zhu, T. Yao, S. Koyama, M. Y. Shen, and T. Goto, *Appl. Phys. Lett.* 70, 2230 (1997).; V. Srikant, V. Sergo, and D. R. Clarke, *J. Am. Ceram. Soc.* 78,1931 (1995).] despite the high mismatch between the two structures.

U.S. Pat. Nos. 5,569,548 and 5,432,397 to Koike et al discuss growing zinc oxide on a sapphire substrate. These patents teach the addition of nickel, iron, or copper to the zinc oxide to improve lattice orientation. U.S. Pat. No. 5,815,520 to Furushima also teaches growing zinc oxide on sapphire.

Similarly to gallium nitride, zinc oxide has a wurtzite-type crystalline structure. Vispute et al. have reported the epitaxial growth of zinc oxide on gallium nitride. This combination is very interesting since the lattice mismatch between these two materials is as low as 1.9%. However, because of the large dislocation density ($\sim 10^9$ cm$^{-2}$) in the gallium nitride grown on c-sapphire, the as-grown zinc oxide films on gallium nitride are known to contain a high density of defects, which mainly include threading dislocations. Thus, it is important to obtain zinc oxide films with high crystalline quality and low dislocation density for the realization of high-efficiency zinc oxide devices. U.S. Pat. No. 5,679,476 to Uemura et al discloses epitaxially growing a non-defect layer on a substrate. U.S. Pat. No. 6,274,518 to Yuri et al epitaxially grows gallium nitride on a substrate. U.S. Pat. No. 6,673,478 to Kato et al epitaxially grows zinc oxide on a gallium nitride layer. Kato et al uses a growth substrate wherein a plurality of the (0001) surfaces are aligned in a sequence of terraces at an inclination angle of 0.1 to 0.5 degree with respect to the growing surface.

The quality of Kato's ZnO is not as high as the quality of the ZnO produced by the process of the present invention.

The epitaxial lateral overgrowth (ELO) method relies on selective epitaxy and growth anisotropy, which significantly reduces the dislocation density of gallium nitride from $10^{8-10}$ to $10^{6-7}$ cm$^{-2}$. [T. Nishinaga, T. Nakano, and S. Zhang, Jpn. J. Appl. Phys. 27 L964 (1988).; T. S. Zheleva, O.-H. Nam, M. D. Bremser, and R. F. Davis, *Appl. Phys. Lett.* 71, 2472 (1997).] Y. Honda et. al have proposed Facet-Controlled ELO (FACELO-through various growth parameters to control the growth facets) and also successfully reduced the dislocation density to the same level. [Y. Honda, Y. Iyechika, T. Maeda, H. Miyake and K. Hiramatsu *Jpn. J. Appl. Phys.* 40 L309 (2001)] Thus, it is promising to utilize the high-quality ELO gallium nitride to obtain zinc oxide films with lower defect density. In this invention, an epitaxial growth of zinc oxide films using FACELO gallium nitride template on sapphire (0001) is reported. By employing $SiO_2$ as a mask layer, the selective growth of zinc oxide films has been realized. Electron microscopy studies show the films are single crystalline structures with low dislocation density. Photoluminescence (PL) spectroscopy demonstrates a strong ultraviolet (UV) peak from the zinc oxide. The green emission is also effectively suppressed by the high crystalline quality of zinc oxide.

Potential applications of the invention include UV detectors, light emitting diodes, laser diodes capable of emitting blue and green light and other optical electronics applications. Other applications also include transparent conductors, dielectrics and solar cells.

SUMMARY OF THE INVENTION

It is therefore a principal object of the present invention to provide a new method of fabricating a zinc oxide semiconductor epilayer on a patterned gallium nitride template.

It is another object of the invention to provide a method of fabricating a zinc oxide substrate wafer that is suitable for industrial zinc oxide fabrication.

In accordance with the objects of the invention, a new method of fabricating a zinc oxide semiconductor layer is achieved. An underlying gallium nitride layer is covered with a mask that includes an array of openings therein. An overgrown gallium nitride semiconductor layer is formed on the underlying gallium nitride layer through the array of openings. Zinc oxide is laterally grown on the overgrown gallium nitride semiconductor layer to form a continuous overgrown single crystalline zinc oxide semiconductor layer.

Also in accordance with the objects of the invention, an electronic or optoelectronic device is achieved, comprising: an underlying gallium nitride layer having a predetermined defect density, an overgrown gallium nitride layer contacting the underlying gallium nitride layer through an array of openings in a mask wherein (1122) facets form in the overgrown gallium nitride layer resulting in a lower defect density than the predetermined defect density, a continuous film of zinc oxide layer overlying the overgrown gallium nitride layer forming a zinc oxide semiconductor layer, and an optoelectronic or microelectronic device in the continuous zinc oxide semiconductor layer.

BRIEF DESCRIPTION OF THE DRAWINGS

In the accompanying drawings forming a material part of this description, there is shown.

DESCRIPTION OF THE PREFERRED EMBODIMENTS

Figure 1A:
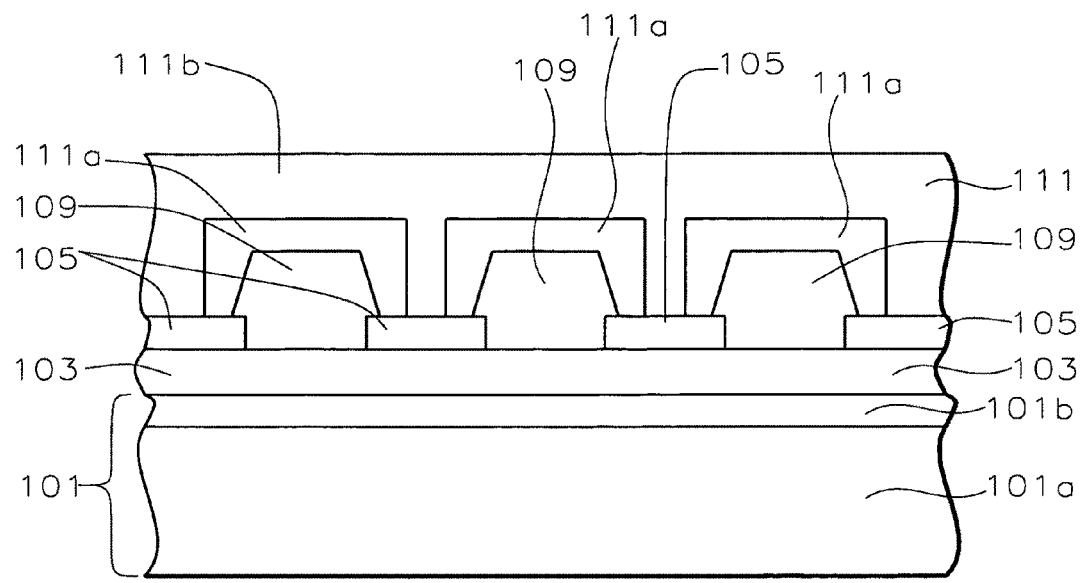
FIG. 1A illustrates the cross sectional view of an example of a ELO zinc oxide semiconductor structure fabricated according to the present invention.

Zinc oxide films have been successfully grown on the ELO gallium nitride templates of the present invention. The high-quality ELO gallium nitride is used to obtain zinc oxide films with lower defect density. Furthermore, compared to the conventional single crystalline zinc oxide substrate growth by the hydrothermal method, the present invention can easily be used to get a 2-inch and 3-inch zinc oxide substrate wafer. As such, the proposed method of fabrication is also suitable for industrial zinc oxide fabrication.

The proposed method for the growth of zinc oxide films on ELO gallium nitride is described as follows:

A 1-2 μm single crystalline gallium nitride layer grown on any substrate, such as sapphire, by any well known method may be used here, such as metal organic chemical vapor deposition (MOCVD). A $SiO_2$ mask layer is deposited by plasma enhanced chemical vapor deposition (PECVD) at a temperature of about 280° C. on the gallium nitride (0001) surface. Then the $SiO_2$ mask is patterned into stripes oriented in the gallium nitride $<1\bar{1}00>$ direction by conventional photolithography. Next, the gallium nitride is re-grown by metal organic chemical vapor deposition (MOCVD) with trimethyl gallium (TMGa) and ammonia ($NH_3$) used as sources for Ga and $N_2$ with $H_2$ as a carrier gas. Next, the ELO gallium nitride/sapphire substrates are put into a tube furnace to grow zinc oxide films by chemical vapor deposition and condensation of Zn (99.9% purity) powder in the presence of oxygen.

It is found that the photoluminescence from the zinc oxide films is centered at 379 nm at room temperature. The luminescence from the zinc oxide films is in the UV region, which is suitable for the fabrication of UV LEDs. Further, it is noticed that the intensity of the green band in zinc oxide PL spectra is very low as shown in FIG. 9B suggesting a low concentration of defects in the fabricated zinc oxide films. This is because green emission in zinc oxide is normally ascribed to the oxygen vacancies and/or interstitial zinc ions in a zinc oxide lattice.

The present invention is now described more fully hereinafter with reference to the accompanying drawings, in which embodiments of the inventions are shown. This invention may, however, be embodied in many different forms and should not be construed as limited to the embodiments set forth herein. In the drawings, the thicknesses of layers and regions are exaggerated for clarity and are not drawn to scale.

Referring now to FIG. 1A, ELO zinc oxide structures according to the present invention are illustrated. The ELO zinc oxide structures 100 include a substrate 101. The substrate may be sapphire, silicon, SiC or any other suitable substrates. However, preferably, a sapphire (0001) substrate 101a is used and a low temperature gallium nitride buffer layer 101b is grown on the sapphire substrate 101a.

The fabrication of substrate 101 is well known to those skilled in the art and need not be described further. An underlying gallium nitride layer 103 is also grown on the buffer layer 101b on top of substrate 101a. The underlying gallium nitride layer 103 may be between about 1.0 and 2.0 μm thick, and may be formed using heated metal organic chemical vapor deposition (MOCVD). The underlying gallium nitride layer generally has an undesired relatively high defect density, for example dislocation densities of between about $10^8$ and $10^{10}$ $cm^{-2}$. These high defect densities may result from mismatches in lattice parameters between the buffer layer 101b and the underlying gallium nitride layer 103. These high defect densities may impact performance of microelectronic and optoelectronic devices in the underlying gallium nitride layer 103.

As shown in FIG. 1A, a mask such as a silicon dioxide mask 105 is formed on the underlying gallium nitride layer 103. The mask 105 includes an array of openings therein. Preferably, the openings are stripes that extend along the $<1\bar{1}00>$ direction of the underlying gallium nitride layer 103. The mask 105 may have a thickness of about 100 nm and may be formed on the underlying gallium nitride layer 103 using plasma enhanced chemical vapor deposition (PECVD) at about 280° C. The mask 105 may be patterned using standard photolithography techniques and etched in a buffered hydrofluoric acid (HF) solution.

Figure 3:
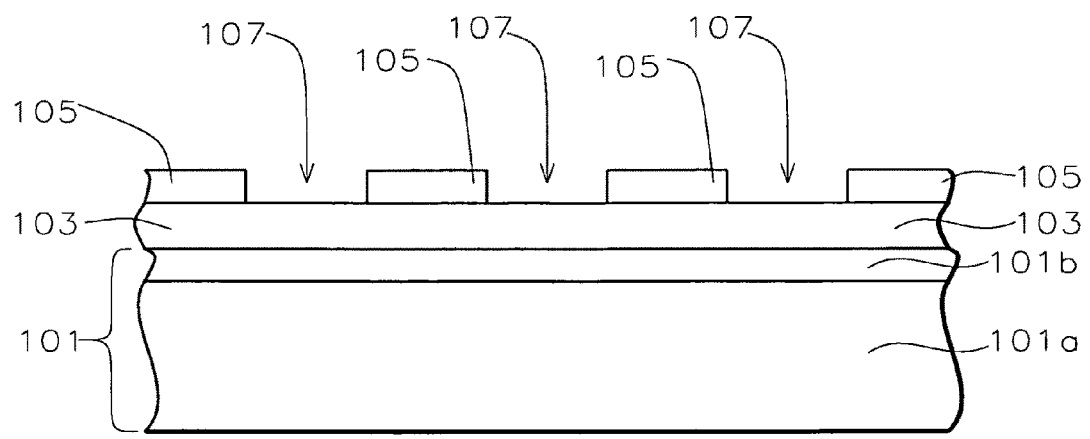

FIG. 1A also illustrates a $\{11\bar{2}2\}$ facets gallium nitride layer 109 grown from the underlying gallium nitride layer 103 and through the array of openings in window area 107 (see FIG. 3). The ELO zinc oxide semiconductor structure 100 also includes zinc oxide layer 111a that is grown by chemical vapor deposition and a lateral zinc oxide layer 111b that extends laterally from the $\{11\bar{2}2\}$ facets gallium nitride layer 109. The lateral zinc oxide layer 111b may be formed using vapor phase epitaxy (CVD) as described below. As used herein, the term "lateral" denotes a direction parallel to the faces of substrate 101.

As shown in FIG. 1A, lateral overgrown zinc oxide layer 111b coalesces at interface 111a to form a continuous single crystalline zinc oxide semiconductor layer 111. It has been found that the threading dislocations in the lateral grown zinc oxide layer 111 will be bent into the lateral direction even though some threading dislocations will remain and go through the top zinc oxide surface in the window area. Thus, lateral zinc oxide layer 111b can have a relatively lower defect density, for example less that $10^4$ $cm^{-2}$. Accordingly, the lateral overgrown zinc oxide layer 111b is of device quality.

Figure 2:
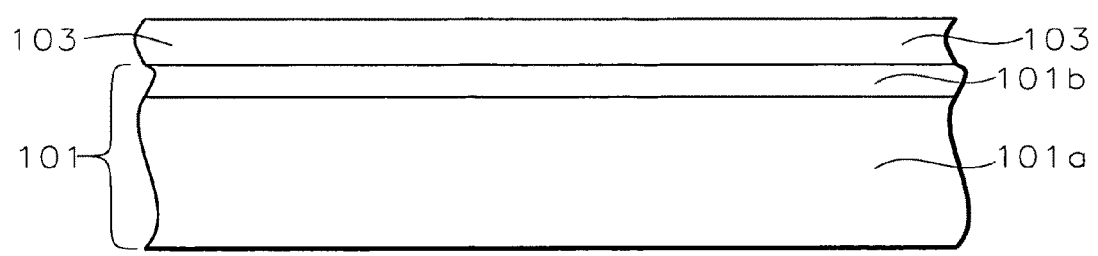
FIGS. 2 through 6 illustrate the cross sectional views of each intermediate fabrication step of the example in FIG. 1.

Referring now to FIGS. 2-5, methods of fabricating ELO zinc oxide semiconductor structures according to the present invention will now be described. As shown in FIG. 2, an underlying gallium nitride layer 103 is grown on a substrate 101. The substrate 101 may include a sapphire (0001) substrate 101a and a low temperature grown gallium nitride buffer layer 101b. The low temperature (500° C.~600° C.) gallium nitride buffer layer 101b may be deposited on the sapphire substrate 101a in a cold wall vertical and inductively heated metal organic chemical vapor deposition (MOCVD) system up to 30~40 nm thick. The gallium nitride layer 103 may be between 1.0 and 2.0 µm thick, and may be grown at a temperature of at least 1000° C. on the low temperature gallium nitride buffer layer using any well known method such as molecular beam epitaxy (MBE), hydride vapor phase epitaxy (HVPE) and metal organic chemical vapor deposition (MOCVD).

Referring to FIG. 3, the underlying gallium nitride layer 103 is masked with a mask layer 105 that includes an array of openings 107 therein. The mask layer consists of a material (e.g. $SiO_2$ or SixNy) that does not allow the growth of subsequent gallium nitride that is deposited on it; i.e. selective to the deposition of gallium nitride. That is, GaN will only grow on the opening area 107 and will not grow on the mask materials 105. For example, $SiO_2$ or SiN can be used for the mask. The mask layer may have a thickness of about 100 nm and may be formed on the underlying gallium nitride layer 103 using plasma enhanced chemical vapor deposition (PECVD) at 280° C. The mask 105 may be patterned using standard photolithography techniques and etched in a buffered hydrofluoric acid (HF) solution. Other conventional methods such as dry etching using Reactive Ion etching (RIE) or Inductively Coupled Plasma (ICP) etching may also be used. In one embodiment, the openings 107 are 3 µm wide along the <1$\bar{1}$00> direction on the underlying gallium nitride layer 103. The ratio of width of the gallium nitride window area to the $SiO_2$ wing area can be defined as any value. Prior to further processing, the structure may be dipped in a 50% buffered hydrochloric acid (HCl) solution to remove surface oxides formed on the underlying gallium nitride layer 103.

Figure 4:
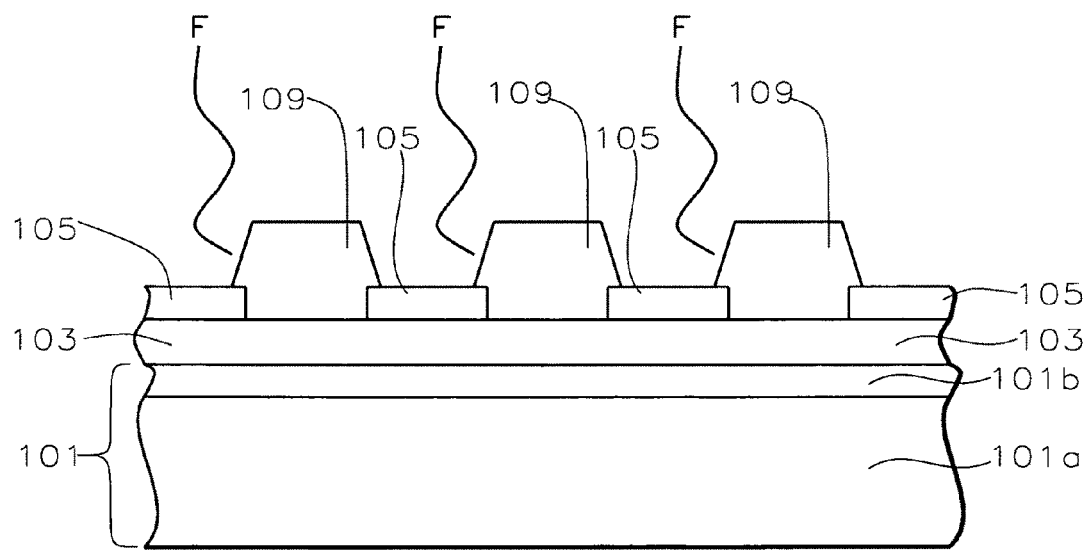

Referring now to FIG. 4, the underlying gallium nitride layer 103 is grown through the array of openings 107 to form {11$\bar{2}$2} facets F gallium nitride layer 109 grown from the underlying gallium nitride 103 and through the array of openings in window area 107. The {11$\bar{2}$2} facets F gallium nitride layer 109 may be grown using MOCVD at about 900-950° C. and with a pressure in the range of 200-500 Torr. Precursors of trimethylgallium (TMGa) at 80 µmol/min and $NH_3$ at around 11 slm may be used to form the gallium nitride layer 109. If gallium nitride alloys are formed, additional conventional precursors of aluminum or indium, for example, may also be used. Triethylgallium (TEGa) or ethyldimethyl gallium (EDMGa) can also be used as group III precursors, while dimethylhdrazine (($H_2N_2(CH_3)$)$_2$. 1,1DMH$_y$) is preferred as a N precursor. The ELO gallium nitride layers are grown by controlling the facet planes via choosing the growth temperature and the reactor pressure. The typical growth temperature and reactor pressure used for achieving growth on the desired facet planes are 900~950° C. and a pressure with the range of 200-500 Torr, respectively. The original serrated ELO gallium nitride stripe 109 has a height of 5 µm and a width of 7 µm, for example.

It is also understood that lateral growth in two directions may be used to form an overgrown gallium nitride semiconductor layer. Specifically, mask 105 may be patterned to include an array of openings 107 that extend along either <1$\bar{1}$00> or <11$\bar{2}$0>. The openings can form striped patterns.

Figure 5:
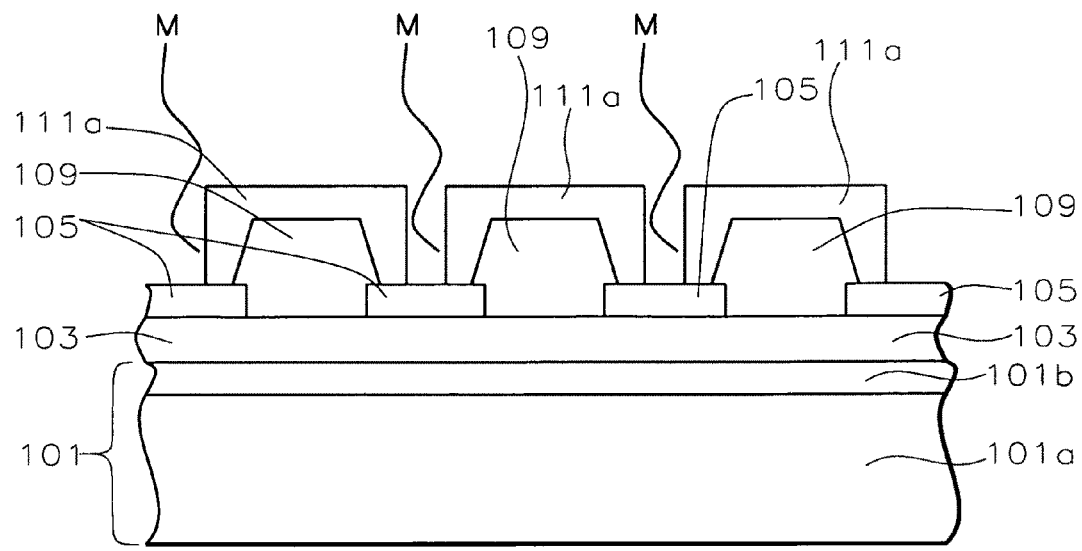

Referring now to FIG. 5, the ELO gallium nitride/sapphire substrates are put into a tube furnace to grow zinc oxide films by chemical vapor deposition and condensation of Zn powder in the presence of oxygen. The continued growth of the zinc oxide layer 111a causes lateral overgrowth of zinc oxide on the underlying gallium nitride layer 109, to form lateral zinc oxide (11$\bar{2}$0) facets M. The growth of the zinc oxide layer 111a is formed by chemical vapor deposition and condensation of Zn (99.9% purity) powder in the presence of oxygen. An alumina boat with Zn powder is placed at the center of a quartz tube and purged with Helium (99.999% purity) flowing at a rate of 100 standard cubic centimeters per minute (sccm). The furnace temperature is increased to around 750° C.~850° C., and oxygen (99.99% purity) flow is introduced to the tube reactor at a flow rate of 10~100 sccm, and preferably 10~20 sccm.

The $O_2$ is mixed with He gas and the flow is maintained throughout the whole reaction process. Pictures of the zinc oxide layer for 30-minute growth and 40-minute growth are shown in FIG. 7.

Figure 6:
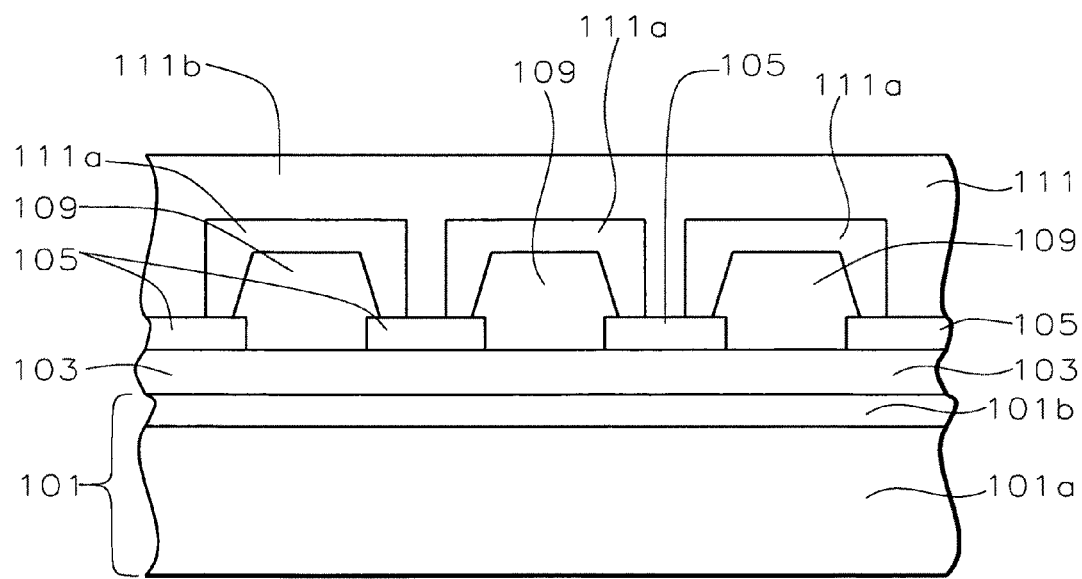

Referring now to FIG. 6, lateral overgrowth is allowed to continue until the lateral growth fronts coalesce at interfaces 111a, to form a continuous zinc oxide layer 111. The total growth time may be approximately 60 minutes. The ZnO film thickness is dependent on the growth time. For example, an experimental thickness of 8.9 µm was achieved after a growth time of 30 minutes.

Figure 1B:
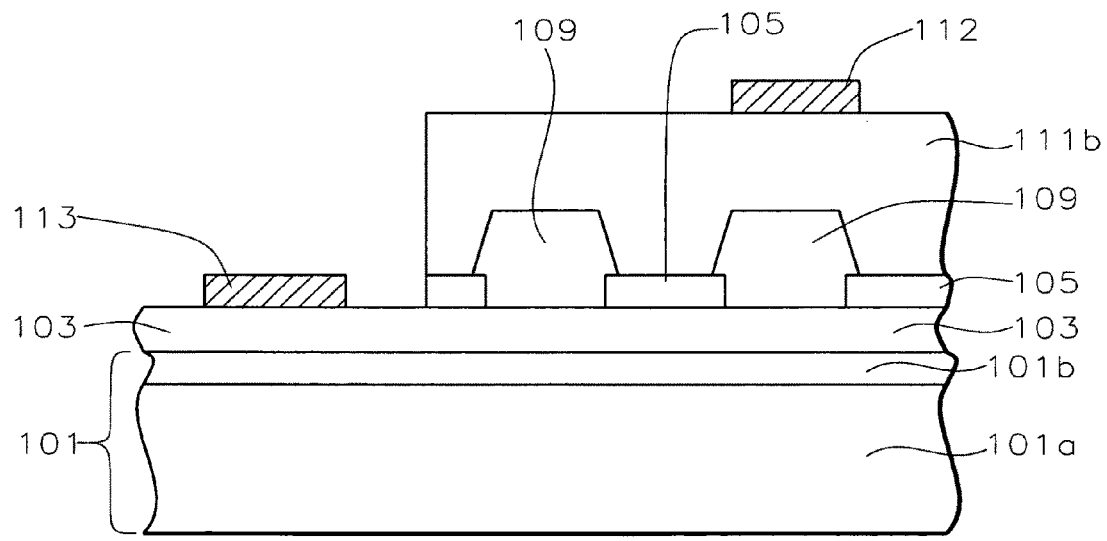
FIGS. 1B and 1C show two schematic cross sectional views of the ZnO-containing compound semiconductor device according to possible applications of the present invention.

As shown in FIG. 1B, microelectronic and optoelectronic devices may then be formed in regions 111b. Devices may also be formed in region 111a if desired.

Figure 1C:
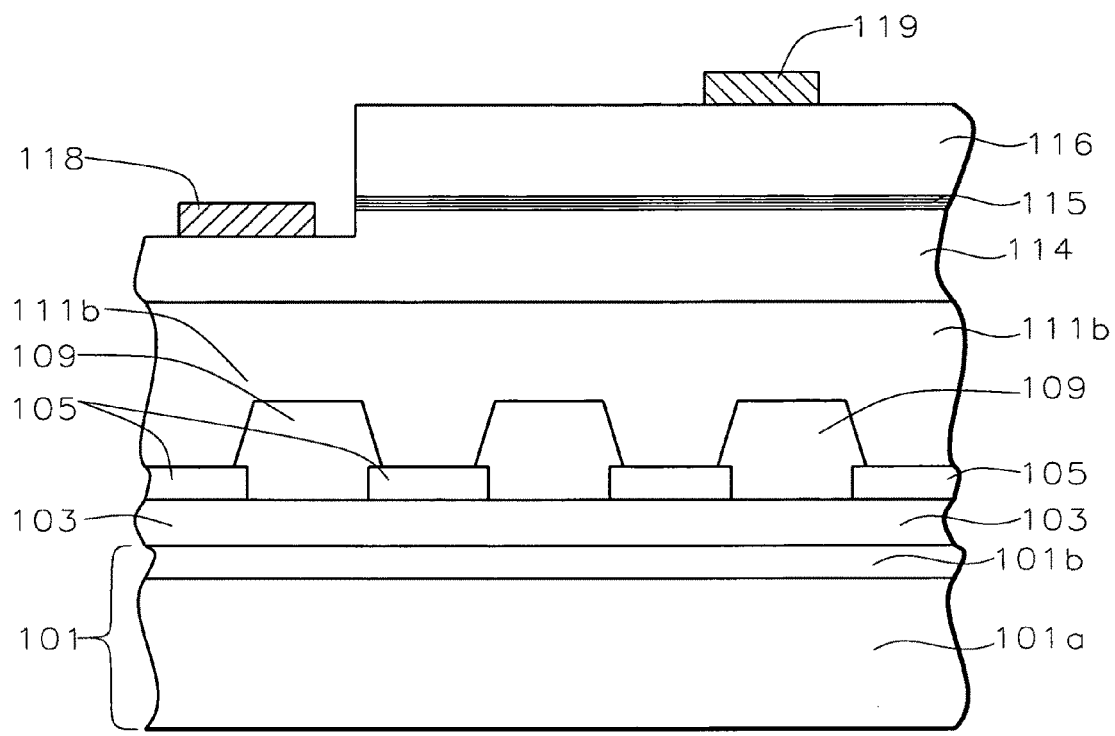

Examples of ZnO semiconductor devices are described below. FIGS. 1B and 1C schematically show two ZnO semiconductor devices according to an embodiment of the present invention. Explanation for elements used in FIGS. 1B and 1C that are identical to those shown in FIG. 1A is omitted by giving similar reference symbols.

In the semiconductor device shown in FIG. 1B, a GaN layer 101 is formed on the sapphire substrate, and thereon the p-type GaN single crystalline templates (103 and 109) and the n-type ZnO single crystalline layer 111b are grown sequentially.

The n-type ZnO single crystalline layer 111b is a ZnO single crystalline layer having a film thickness determined by the requirement for coalescence of the ZnO grown from the GaN ridges. The ZnO is doped by a group III element such as gallium (Ga) or aluminum (Al) to a concentration of about $10^{18}$ cm$^{-3}$. Part of the n-type ZnO single crystalline layer 111b is removed to enable the formation of the p-type contact with GaN 113. A first electrode 112 is formed as the metal contact to the n-type ZnO.

In order to form ohmic-contact between the n-type ZnO single crystalline layer 111b and the first electrode 112, it is preferable that the first electrode 112 is formed by, for example, indium (In) and aluminum (Al).

A pn-junction is formed by forming, for example, a p-type GaN layer 103 having a thickness of 1 to 4 µm.

A second electrode 113 is formed on a region of the exposed surface of the p-type GaN single crystalline layer 103. For making ohmic-contact between the p-type GaN single crystalline layer 103 and the second electrode 113, metal such as nickel (Ni), platinum (Pt), palladium (Pd), gold (Au), etc., an alloy of two or more of these metals, or a multilayer stack or these metal films is used.

In a semiconductor device as described above, a positive voltage is applied to the second electrode 113 relative to the first electrode 112, to allow a forward current across the pn-junction. Recombination of electrons and positive holes in the region of the p-type GaN 109/n-type ZnO 111b interface, or the like, produces light emission. It is possible to use the resulting device as a light emitting diode.

In the semiconductor device shown in FIG. 1C, a GaN layer 103 is formed on the sapphire substrate, and thereon the ZnO 111*b* grown on the GaN ridges 109 is used as the substrate for the further device structures. The n-type ZnO 114, ZnO/Mg/ZnO quantum well structures 115, and p-type ZnO layers 116 are grown in this order.

The n-type ZnO single crystalline layer 114 is a ZnO single crystalline layer having a film thickness of 1-4 μm on the surface of the ZnO 111*b*. The ZnO is doped by a group III element such as gallium (Ga) or aluminum (Al) to a concentration of about $10^{18}$ cm$^{-3}$. Part of the n-type ZnO single crystalline layer 114 is removed to enable the formation of the n-type contact. A first electrode 118 is formed as the metal contact to the n-type ZnO.

In order to form ohmic-contact between the n-type ZnO single crystalline layer 114 and the first electrode 118, it is preferable that the first electrode 118 is formed by, for example, indium (In) and aluminum (Al).

A pn-junction is formed by forming, for example, a p-type ZnO layer 116 having a thickness of 1 to 4 μm.

A second electrode 119 is formed on a region of the exposed surface of the p-type ZnO single crystalline layer 116. For making ohmic-contact between the p-type ZnO single crystalline layer 116 and the second electrode 119, metal such as nickel (Ni), platinum (Pt), palladium (Pd), gold (Au), etc., an alloy of two or more of these metals, or a multilayer stack or these metal films is used.

In a semiconductor device as described above, a positive voltage is applied to the second electrode 119 relative to the first electrode 118, to allow a forward current across the pn-junction. Recombination of electrons and positive holes in the region of the quantum well structures 115, or the like, produces light emission. It is possible to use the resulting device as a light emitting diode.

In the above, although the crystal-growth substrate, the manufacturing method of the ZnO semiconductor crystal, and the ZnO semiconductor device according to the embodiments of the resent invention are explained, the present invention is not limited to the embodiments.

EXAMPLE

The following Example is given to show the important features of the invention and to aid in the understanding thereof. Variations may be made by one skilled in the art without departing from the spirit and scope of the invention.

Figure 7A:
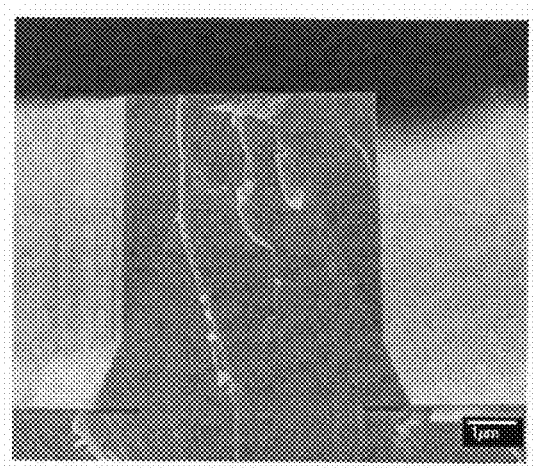
FIGS. 7A and 7B show the cross-sectional scanning electron microscopy (SEM) and the top view SEM images, respectively, of the zinc oxide/ELO gallium nitride grown for 30 minutes.
Figure 7B:
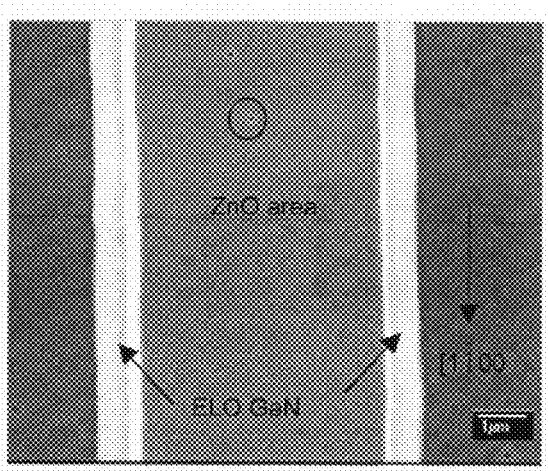
Figure 7C:
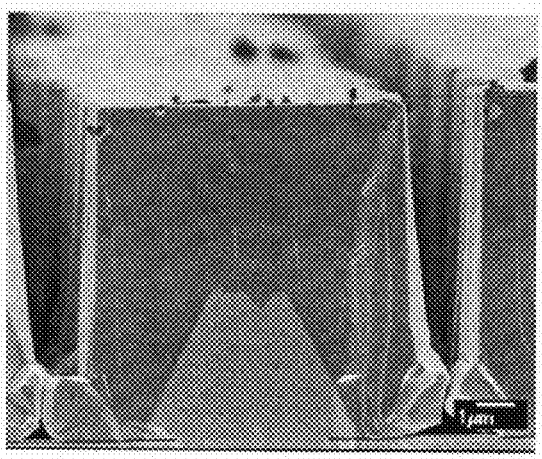
FIGS. 7C and 7D show the cross-sectional SEM and the top view SEM images, respectively, of the zinc oxide/ELO gallium nitride grown for 40 minutes.
Figure 7D:
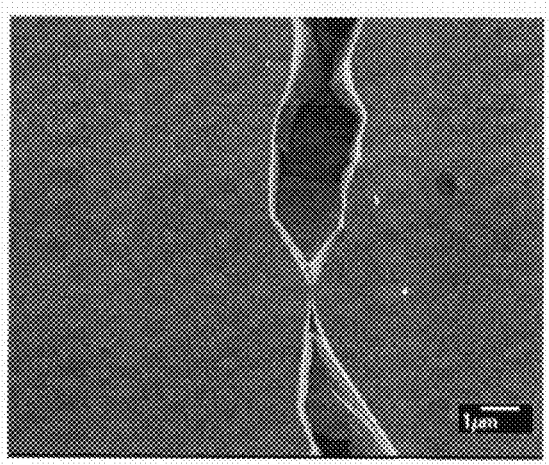

FIGS. 7A and 7C show cross-sectional SEM images of zinc oxide films grown on the ELO gallium nitride templates of the present invention for 30 minutes and 40 minutes, respectively. In FIG. 7A, it can be seen that the original serrated surface of ELO gallium nitride triangular stripe has a height of 5 μm and a width of 7 μm. After zinc oxide growth, the near rectangle shape is observed with a width of about 6.2 μm, indicating that the significant lateral growth of zinc oxide 111*a* occurred on the ELO gallium nitride 109 and the faster growth facet is (11$\bar{2}$0). Furthermore, no growth was found on the SiO$_2$ mask layer. This shows that the zinc oxide top layer was selectively grown on the ELO gallium nitride template. Such morphology originates from the different growth modes between the ELO gallium nitride and c-gallium nitride surface. FIGS. 7B and 7D show the top view of the sample after zinc oxide is grown on the gallium nitride template for 30 mins and 40 mins, respectively. The defect pits (circled) can be found on the surface of the top layer, which may come from the threading dislocation propagating from the ELO gallium nitride into the zinc oxide films.

Figures 8A, 8B:
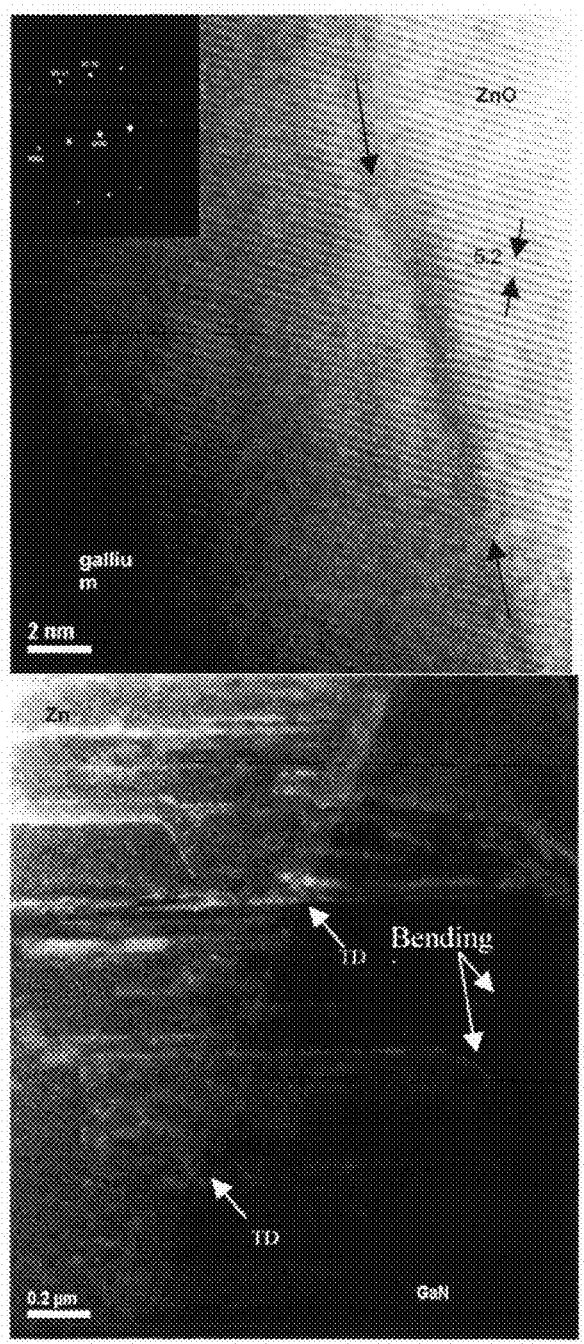
FIG. 8A is a high resolution transmission electron microscopy (HRTEM) image and the corresponding SAED pattern of zinc oxide/ELO gallium nitride interface.
FIG. 8B is a cross-sectional transmission electron microscopy (TEM) image with $g=1\bar{1}00$ near the interface of zinc oxide/ELO gallium nitride.

FIG. 8A shows the typical HRTEM image of the zinc oxide/ELO gallium nitride interface, from which it can be seen that the lattice fringes of zinc oxide are perfectly aligned with those of ELO gallium nitride and the interface is sharp on the atomic level. The corresponding selective area electron diffraction (SAED) pattern is shown in the inset. Only one set of SAED pattern is observed, resulting from the very close lattice matching between zinc oxide and gallium nitride hexagonal structures. The pattern also verifies the perfect epitaxial growth of zinc oxide on gallium nitride and their high crystal quality. A cross-sectional TEM image with lower magnification is presented in FIG. 8B to further show the interface of the zinc oxide/ELO gallium nitride. The formation of the horizontal dislocations (HD's) is very important due to the fact that HD's can dramatically decrease the threading dislocation (TD's) density of the over grown gallium nitride regions. The image in FIG. 8B shows that the laterally overgrown zinc oxide is essentially free of TD's and the HD's lying on the (0001) plane of zinc oxide can be produced by 90°-bending of TD's in gallium nitride (TD 1). The effect of bending can be understood by considering the energy of dislocation lines emerging from a free surface of a crystal. [J. P. Hirth and J. Lothe, *Theory of Dislocations*, 2nd ed. Wiley, New York, (1982)] From the point of view of the dislocation line tension, any dislocation would tend to become perpendicular to a free surface to diminish its energy. As a result, dislocations would gradually change their line directions towards the normal direction of the current facet plane, as can be seen in FIG. 8B, which suggests that high quality zinc oxide films can be pseudomorphically grown (along the {11$\bar{2}$0} facet) on the ELO gallium nitride. Using these growth conditions, high quality zinc oxide epilayers were fabricated on ELO gallium nitride as shown in FIG. 1A. Here, the HRTEM studies further confirm the suitability of ELO gallium nitride layer for zinc oxide growth.

Figure 9:
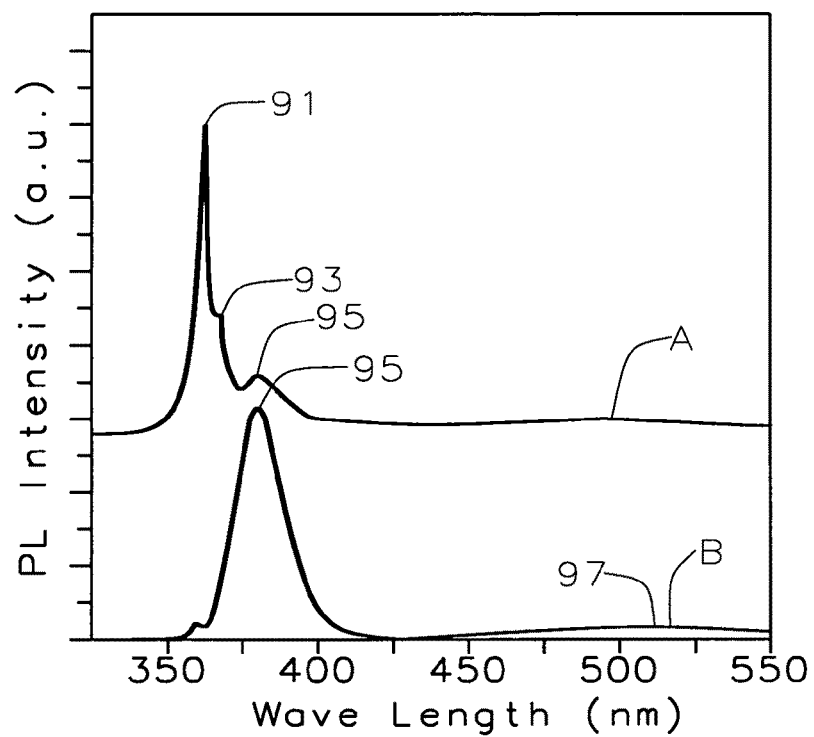
FIG. 9 is the room temperature micro-PL spectra taken from two different regions of the zinc oxide/ELO gallium nitride.

FIG. 9 shows the PL spectrum (a) obtained from ELO gallium nitride area I (shown in FIG. 7B), which is mainly contributed by the ELO gallium nitride. FIG. 9 also shows the PL spectrum (b) obtained from the ELO zinc oxide area II (shown in FIG. 7B), which is mainly ascribed to the ELO zinc oxide layers. The PL spectra for ELO gallium nitride film demonstrate distinct peaks due to the neutral-donor-bound DX exciton emission 91 and free-exciton $D_{2O}$-X transitions with replicas 93. The $D_{2O}$-X PL peak 91 is mainly caused by the Si donors diffusing from the SiO$_2$ mask layers via ELO re-growth. The PL peak of the zinc oxide film 95 clearly shows the 3.27 eV zinc oxide DX free exciton recombination. From the PL studies, it is noted that full width at half maximum (FWHM) of the zinc oxide peak line width is about 11 meV, which is better than the result of 20 meV from heteroepitaxial growth of zinc oxide directly on gallium nitride. Such small FWHM of the zinc oxide films of the present invention is due to their high crystalline quality. It is further noticed that the intensity of the green band 97 in zinc oxide PL spectra is very low in FIG. 9 (b), suggesting a low concentration of defects in these fabricated zinc oxide films, since the green emission in zinc oxide is normally ascribed to the oxygen vacancies and/or interstitial Zn ions in zinc oxide lattice. [e. g. J. Joo, S. G. Kwon, J. H. Yu, T. Hyeon, *Adv. Mater.* 17, 1873, (2005).] Thus, the method of the present invention can be readily used in the growth and fabrication of UV LEDs and LDs.

Figure 10:
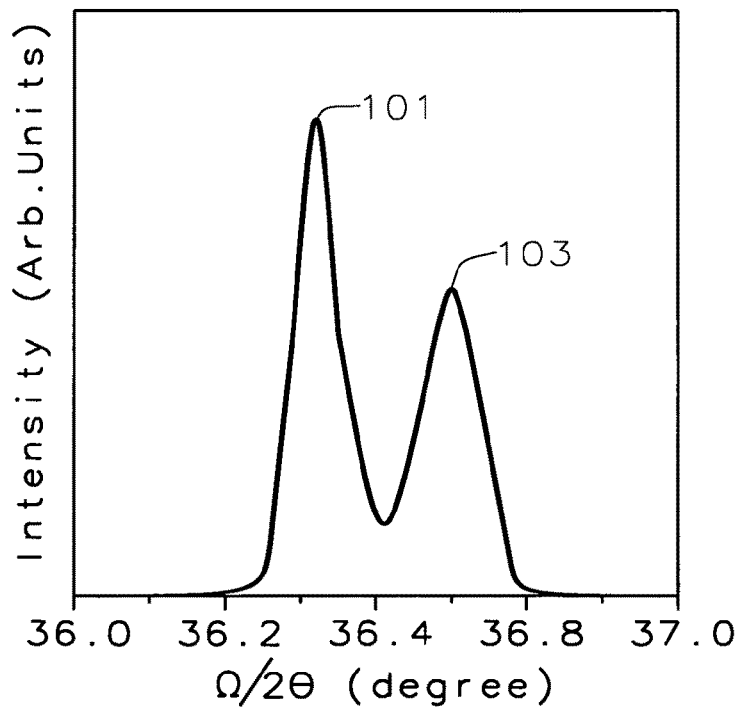
FIG. 10 is the X-ray diffraction $\omega/2\theta$ scan of the epi-zinc oxide/ELO gallium nitride/sapphire (0001) heterostructure.

FIG. 10 shows an X-ray diffraction 'Ω/2θ scan of the zinc oxide film grown on the ELO gallium nitride/sapphire (0001). The results show only (000X) family of planes of zinc oxide 101 and gallium nitride 103 indicating that the zinc oxide/gallium nitride heterostructure is strongly c-axis oriented normal to the sapphire (0001) plane. The XRD rocking curve full width at half maximum (FWHM) for the zinc oxide and gallium nitride films was found to be 3 arcmin and 5 arcmin, respectively.

Figure 11A:
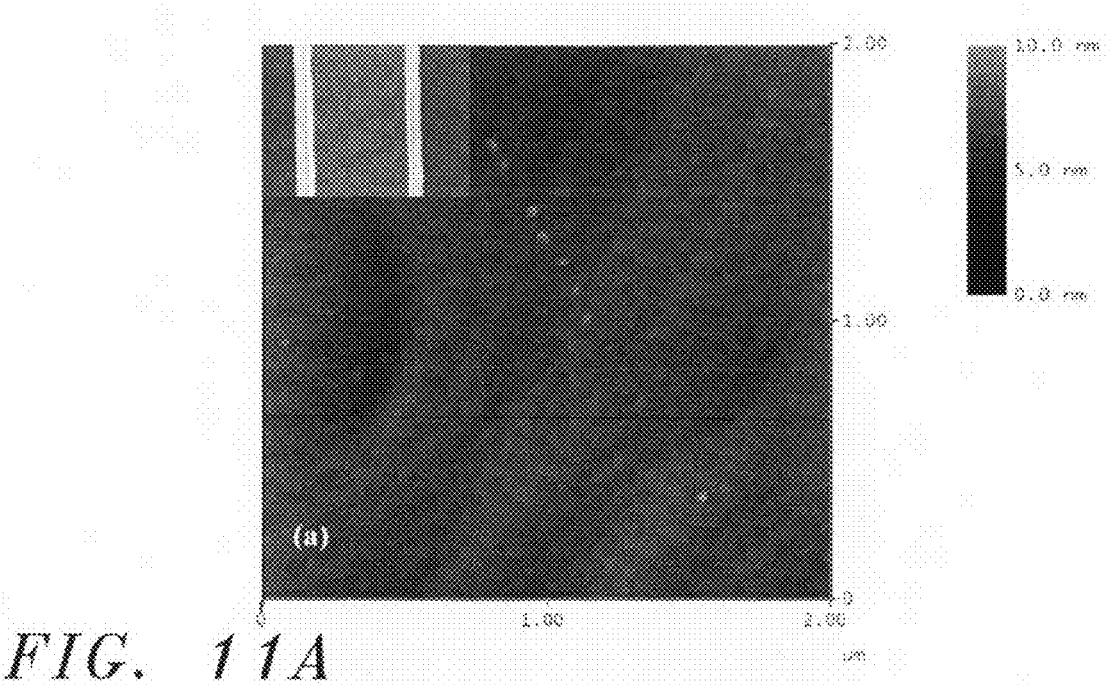
FIG. 11A shows the AFM of the epi-zinc oxide on the ELO gallium nitride surface.
Figure 11B:
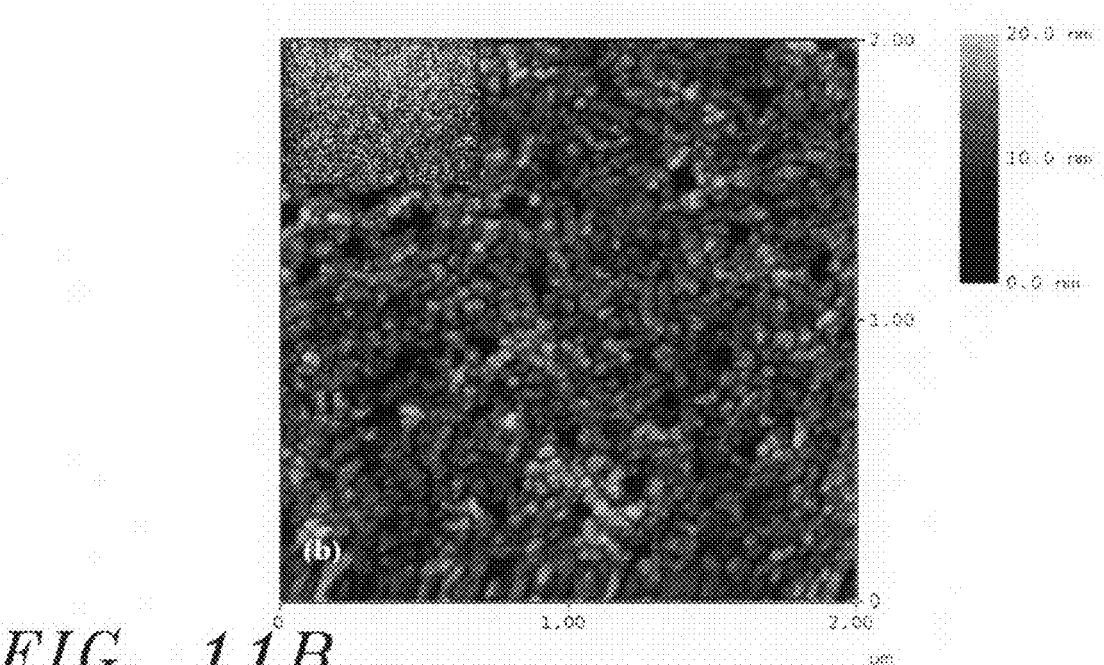
FIG. 11B shows the AFM of the as grown zinc oxide on c-plane gallium nitride surface. Inset shows the SEM of the same surface area of the two different samples.

FIG. 11A shows the surface morphology of the overgrowth sample characterized by the atomic force microscopy (AFM) as well as that of a control sample FIG. 11B grown on c-gallium nitride under the same growth conditions. The root mean squared value of the surface roughness of the lateral overgrown zinc oxide on ELO gallium nitride and the control sample zinc oxide on c-gallium nitride are 0.40 nm and 3.67 nm, respectively. Atomic steps and terraces were observed from the ELO zinc oxide sample. Only a few step terminations in AFM observations were detected, which indicates the high quality of overgrown ZnO sample. The surface pits density of the overgrown gallium nitride sample is more than 100 times reduced compared with the control sample. These small pits are thought to be related to mixed screw and edge dislocations where the step edges meet. This shows that the ELO zinc oxide growth method has an effect on the dislocation behavior in the zinc oxide layer.

Various articles from scientific periodicals and/or patent literature are cited throughout this application. Each of such articles is hereby incorporated by reference in its entirety and for all purposes by such citation.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a zinc oxide semiconductor layer comprising the steps of:
    masking an underlying gallium nitride layer with a mask that includes an array of openings therein;
    forming an overgrown gallium nitride semiconductor layer on said underlying gallium nitride layer through said array of openings; and
    laterally growing zinc oxide on said overgrown gallium nitride semiconductor layer to form a continuous overgrown single crystalline zinc oxide semiconductor layer.

2. The method according to claim 1 further comprising:
    forming at least one optoelectronic or microelectronic device in said overgrown zinc oxide semiconductor layer.

3. The method according to claim 1 wherein said masking step comprises the step of:
    masking said underlying gallium nitride layer with a mask that includes an array of stripe openings therein, wherein said stripe openings are orientated along a <1$\bar{1}$00> direction of said underlying gallium nitride layer.

4. The method according to claim 1 wherein said mask consists of a material that does not allow the growth of subsequent gallium nitride deposited on it.

5. The method according to claim 4 wherein said mask comprises $SiO_2$ or SiN.

6. The method according to claim 1 wherein said masking step comprises the step of:
    masking said underlying gallium nitride layer with a mask that includes an array of stripe openings therein, wherein said stripe openings extend along a <11$\bar{2}$0> direction of said underlying gallium nitride layer.

7. The method according to claim 1 wherein said underlying gallium nitride layer includes a predetermined defect density, and wherein in said subsequent forming said overgrown gallium nitride layer through said array of openings, (11$\bar{2}$2) facets form resulting in a lower defect density than said predetermined defect density.

8. The method according to claim 7 wherein said forming said overgrown gallium nitride layer comprises the step of growing a (11$\bar{2}$2) facets gallium nitride layer using metal organic chemical vapor deposition.

9. The method according to claim 8 wherein said metal organic chemical vapor deposition comprises flowing TMGa at about 80 μmol/min and ammonia at about 11 slm at a growth temperature of about 900 to 950° C.

10. The method according to claim 7 wherein said forming said overgrown gallium nitride layer comprises the step of growing a (11$\bar{2}$2) facets gallium nitride layer using metal organic chemical vapor deposition, molecular beam epitaxy, or hydride vapor phase epitaxy.

11. The method according to claim 7 wherein dislocations that propagate vertically from said underlying gallium nitride layer through said array of openings are bent laterally into said overgrown single crystalline zinc oxide so that said zinc oxide layer is of a lower dislocation defect density than said predetermined defect density.

12. The method according to claim 1 wherein said underlying gallium nitride layer is grown on a substrate comprising sapphire, silicon, SiC or any other suitable substrate.

13. The method according to claim 12 further comprising:
    depositing a gallium nitride buffer layer on said substrate at a temperature of between about 500 and 600° C.; and
    growing said underlying gallium nitride layer on said gallium nitride buffer layer at a temperature of at least 1000° C.

14. A method of fabricating a zinc oxide semiconductor layer comprising the steps of:
    providing an underlying gallium nitride layer having a predetermined defect density;
    masking said underlying gallium nitride layer with a mask that includes an array of openings therein;
    forming an overgrown gallium nitride layer through said array of openings wherein (11$\bar{2}$2) facets form in said overgrown gallium nitride layer resulting in a lower defect density than said predetermined defect density;
    laterally overgrowing a zinc oxide layer using chemical vapor deposition on said overgrown gallium nitride layer until said zinc oxide layer coalesces to form a continuous laterally grown single crystalline zinc oxide semiconductor layer; and
    forming an optoelectronic or microelectronic device in said continuous laterally overgrown zinc oxide semiconductor layer.

15. The method according to claim 14 wherein said laterally overgrown zinc oxide layer extends in a <1$\bar{1}$00> direction of said underlying gallium nitride layer.

16. The method according to claim 14 wherein said laterally overgrowing said zinc oxide layer comprises thermal vapor phase epitaxy formed by flowing 10-100 sccm oxygen over a zinc source heated to a temperature in the range of 750° C.-850° C.

17. The method according to claim 15 comprising the steps of:
    providing a precursor in vapor form substantially comprising of $Zn_AO_B$ wherein subscript A and subscript B are any combination of integers; and
    heating said underlying gallium nitride layer wherein decomposition of at least some of the vapor at the surface of the substrate leads to deposition of a film of zinc oxide by chemical vapor deposition.

18. The method according to claim 17 wherein said heating comprises heating the surface of said substrate to a temperature in the range from 700° C. to 900°C.

19. The method according to claim 14 wherein said overgrowing continues for 30 to 60 minutes.

20. An electronic or optoelectronic device comprising:
an underlying gallium nitride layer having a predetermined defect density;
an overgrown gallium nitride layer contacting said underlying gallium nitride layer through an array of openings in a mask wherein (11$\overline{2}$2) facets in said overgrown gallium nitride layer resulting in a lower defect density than said predetermined defect density;
a continuous film of zinc oxide layer overlying said overgrown gallium nitride layer forming a zinc oxide semiconductor layer; and
an optoelectronic or microelectronic device in said continuous zinc oxide semiconductor layer.

* * * * *

UNITED STATES PATENT AND TRADEMARK OFFICE
CERTIFICATE OF CORRECTION

| | | |
|---|---|---|
| PATENT NO. | : 7,951,639 B2 | Page 1 of 1 |
| APPLICATION NO. | : 12/288977 | |
| DATED | : May 31, 2011 | |
| INVENTOR(S) | : Soo Jin Chua et al. | |

It is certified that error appears in the above-identified patent and that said Letters Patent is hereby corrected as shown below:

On the Title page, Item (75)

Soon Jin Chua, Singapore (first inventor) should be Soo Jin Chua, Singapore.

Signed and Sealed this
Ninth Day of August, 2011

David J. Kappos
*Director of the United States Patent and Trademark Office*

UNITED STATES PATENT AND TRADEMARK OFFICE
CERTIFICATE OF CORRECTION

PATENT NO. : 7,951,639 B2
APPLICATION NO. : 12/288977
DATED : May 31, 2011
INVENTOR(S) : Soon Jin Chua et al.

It is certified that error appears in the above-identified patent and that said Letters Patent is hereby corrected as shown below:

On the Title page, left-hand column, between Item 22 (the U.S. filing date) and Item 65 (the "Prior Publication Data" section), the following sections should be added:

--PCT Filed: April 25, 2007
PCT No.: PCT/SG2007/000117
PCT Pub. No: WO07/123496
PCT Pub. Date: Nov. 1, 2007--

On the Title page, left-hand column, between Item 65 (the "Prior Publication Data" section) and Item 51 (the "Int. Cl." section), the following section should be added:

Item --(63) Related U.S. Application Data
Provisional application No. 60/794,775, filed on April 25, 2006.--

On Title Page 2, Item (56) Lines 27-28 reads, "Bagnall et al. "Optically pumped lasing of ZnO at room termpature", institute of Material Reserach" should read, --Bagnall et al. "Optically pumped lasing of ZnO at room temperature", Institute of Material Research--

On Title Page 2, Item (56) Line 20 reads, "Response to Non-Final OA dated Nov. 25, 2008 fro" should read, --Response to Non-Final OA dated Nov. 25, 2008 for--

Col. 1, Lines 5-7 reads, "This application claims priority to U.S. Provisional Patent Application Ser. No. 60/794,775 filed..." should read, --This application is a § 371 National Stage of International Patent App. No. PCT/SG2007/000117 filed April 25, 2007, which claims priority to U.S. Provisional Patent Application Ser. No. 60/794,775 filed on April 25, 2006--

Signed and Sealed this
Twentieth Day of September, 2011

David J. Kappos
*Director of the United States Patent and Trademark Office*